United States Patent [19]
Xu et al.

[11] Patent Number: 6,111,270
[45] Date of Patent: Aug. 29, 2000

[54] LIGHT-EMITTING APPARATUS AND METHOD OF FABRICATION

[75] Inventors: Ji-Hai Xu, Gilbert; Franky So, Tempe, both of Ariz.; Hsing-Chung Lee, Calabasas, Calif.

[73] Assignee: Motorola, Inc., Schaumburg, Ill.

[21] Appl. No.: 09/066,792

[22] Filed: Apr. 27, 1998

[51] Int. Cl.[7] .......................... H01L 33/00; H01L 29/786; H05B 33/00

[52] U.S. Cl. .................. 257/72; 257/71; 257/40; 257/89; 257/103

[58] Field of Search .................. 257/40, 71, 89, 257/103, 72

[56] References Cited

U.S. PATENT DOCUMENTS 5,670,792  9/1997  Utsugi ........................................ 257/40
5,674,636  10/1997  Dodabalapur ............................. 372/41

FOREIGN PATENT DOCUMENTS 0717445  6/1996  European Pat. Off. ................. 257/40

*Primary Examiner*—Jerome Jackson, Jr.
*Attorney, Agent, or Firm*—Eugene A. Parsons; William E. Koch

[57] ABSTRACT

Light emitting apparatus is disclosed including a thin film transistor, a capacitor and an organic electroluminescent device. The thin film transistor includes a semiconductive layer having spaced apart first and second doped regions defining first and second current carrying terminals with a channel therebetween, an insulating layer overlying the channel and a control terminal formed on the insulating layer. A portion of the control terminal overlies a portion of the first doped region to form the capacitor. The organic electroluminescent device includes a first terminal connected to the second current carrying terminal.

10 Claims, 1 Drawing Sheet

LIGHT-EMITTING APPARATUS AND METHOD OF FABRICATION

FIELD OF THE INVENTION

The present invention pertains to electroluminescent devices and more specifically to thin-film-transistor organic electroluminescent devices.

BACKGROUND OF THE INVENTION

Advances in flat panel displays (FPD) technology have made high quality, large area, full color high resolution displays possible. Currently, liquid crystal displays (LCD) are the display of choice. A major drawback to LCD panels is their poor performance in low ambient light conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices, such as portable electronic devices and consume considerable power which adversely affects portable display applications.

Organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

A drawback with OED devices are that they are difficult to drive using simple two-terminal schemes because of their lack of memory. The rise and decay time of an OED is very fast and does not have intrinsic memory. To overcome this problem, four terminal thin-film-transistor (TFT) devices have been developed to drive OED devices. These devices include two TFTs, a storage capacitor and an OED pad arranged on a substrate. The storage capacitor enables the excitation power to an addressed EL element to stay on once it is selected.

While successfully overcoming the above mentioned problem, the storage capacitor process and deposition are very complicated and difficult to achieve in a fabrication process. In these devices, a capacitor is formed by the gate electrode, acting as the bottom electrode of the capacitor, separated from an overlying top electrode by a gate oxide insulating layer. The top electrode is connected to the source region. An example of this structure can be seen in European Patent Office Publication No. EP O 717,445 A2, published Jun. 19 1996. Several problems are apparent in this type of device, namely, the process is complicated and leakage is possible due to the sharp edge at the anode of the OED formed by the capacitor process.

In spite of all the advantages of OEDs there are still some draw backs to their use. One of the drawbacks is the fact that light emitted by OEDs is dependent upon the amount of current applied to the OED. Thus, to produce sufficient light for use in displays substantial amounts of current must be applied. As a typical example, with a 64×32 array of devices forming a four line by 11 character display the following devices will use approximately the listed amount of power to produce equal light out. If the devices are semiconductor light emitting diodes the display will require approximately 1 Watt (w) of power; organic light emitting diodes will require approximately 150 mw of power; LCDs with a backlight will require approximately 120 mw of power; and reflective LCDs will require approximately 20 mw of power.

Conventional TFT-OED displays suffer from several limitations, including insufficient brightness, relatively high power consumption, and poor chromaticity. In particular, the red-color OED usually shows poor efficiency and short lifetime, which do not meet with the requirements of a full color display. An additional problem in the use of OEDs in displays is the generation of the colors necessary to achieve a full color display. Red, green and blue OEDs can be fabricated but they require different organic materials and, thus, each color must be fabricated separately. Furthermore, the colors achieved are not a pure primary color, but have a relatively broad spectrum.

Accordingly, it is highly desirable to provide a new and improved light emitting apparatus and method of fabrication.

It is another purpose of the present invention to provide a new and improved light emitting apparatus with enhanced performance.

It is a further object of the present invention to provide a new and improved method of fabricating a light emitting apparatus with a simplified process.

It is a further object of the present invention to provide a new and improved method of fabricating a light emitting apparatus having a microcavity fabricated with a simplified process.

It is yet another object of the present invention to provide a light emitting apparatus with a capacitor.

It is yet a further object of the present invention to provide a light emitting apparatus with a microcavity for light enhancement with reduced power consumption.

SUMMARY OF THE INVENTION

The above problems and others are at least partially solved and the above purposes and others are realized in a light emitting apparatus including a thin film transistor (TFT), a capacitor and an OED having a microcavity. The TFT including a semiconductive layer having spaced apart first and second doped regions defining first and second current carrying terminals with a channel therebetween, an insulating layer overlying the channel and a control terminal formed on the insulating layer. A portion of the control terminal overlying a portion of the first doped region defines a capacitor. The organic electroluminescent device has a first terminal connected to the second current carrying terminal, and the microcavity structure in cooperation with the organic electroluminescent device defines an optical length such that light emitted from the microcavity structure is enhanced. In additional embodiments, color filters are provided.

Also provided is a method of fabricating a light emitting apparatus including a thin film transistor, a capacitor and an organic electroluminescent device having a microcavity. In additional embodiments, color filters are provided.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
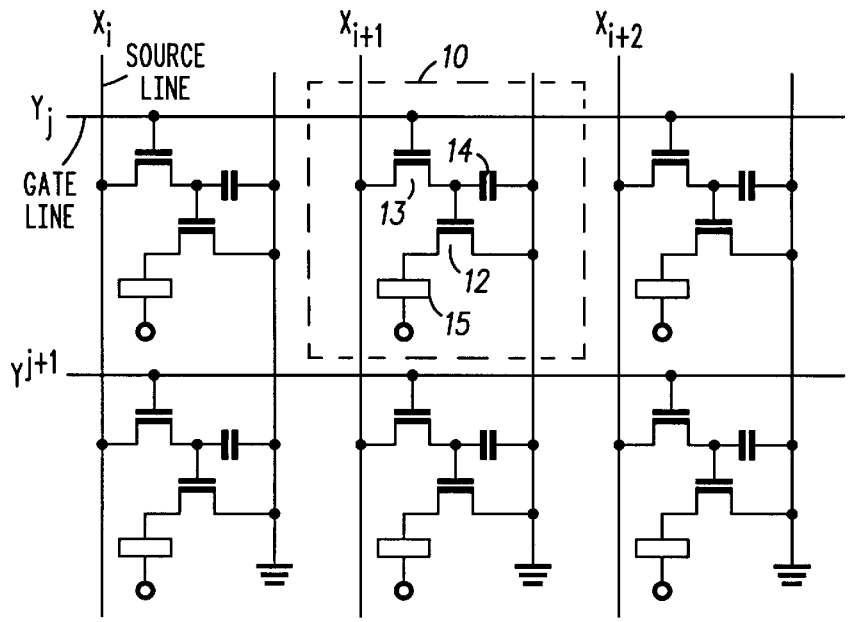
FIG. 1 is a schematic diagram of an active matrix 4-terminal light emitting apparatus.

Turning now to the drawings in which like reference characters indicate corresponding elements throughout the several views, attention is first directed to FIG. 1 which illustrates the schematic of an active matrix 4-terminal display light emitting apparatus including a plurality of addressable pixels. A pixel 10, indicated by broken lines, includes a power TFT 12, an addressable TFT 13, a storage capacitor 14 and an QED element 15. The major advantage of the 4-terminal scheme is the ability to decouple the addressing signal from the OED excitation signal. OED elements are selected via the addressable TFTs and the excitation power to the OED element is controlled by the power TFT. The storage capacitors enable the excitation power to an addressed OED element to stay on once it is selected. Thus, the circuit provides a memory that allows the OED element to operate at a duty cycle of close to 100%, regardless of the time allotted for addressing.

Figure 2:
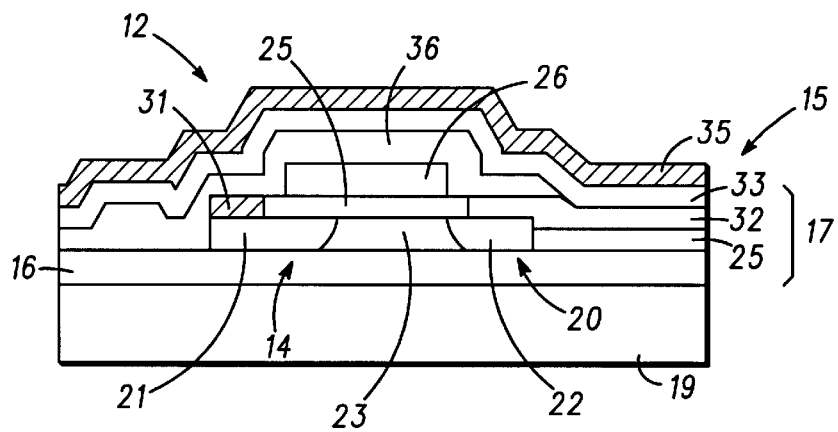
FIG. 2 is a simplified sectional view of a light emitting apparatus according to the present invention.

Turning now to FIG. 2, a simplified cross sectional view of pixel 10 is illustrated. Pixel 10 includes power TFT 12, addressable TFT 13 (not shown), storage capacitor 14 and OED element 15. A dielectric stack 16 is positioned on a supporting structure, in this embodiment a transparent insulating substrate 19, such as glass, or the like and includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, dielectric stack 16 is formed of alternate layers of TiO2 and SiO2. Generally, from 2 to 4 pairs of layers provides a reflectivity of approximately 0.74, which is believed to be optimal for the present purpose. As is understood by those skilled in the art, each pair of layers of dielectric stack 16 defines a partial mirror with an operating thickness of an integer multiple of one half wavelength of the emitted light so that all reflected light is in phase.

Power TFT 12 includes a semiconductive layer 20 positioned on dielectric stack 16. Semiconductive layer 20 is patterned using conventional techniques to expose a portion of dielectric stack 16 defining a portion of a microcavity 17. Microcavity 17 will be described in more detail below. Semiconductive layer 20 can be further patterned to form a plurality of pixels 10 in active matrix 4-terminal display light emitting apparatus.

First and second spaced apart doped regions 21 and 22 are formed in semiconductive layer 20 by some convenient method, such as implanting, diffusion, or the like. N+ type doping is preferred to permit easy integration with standard semiconductor circuitry. Doped regions 21 and 22 define first and second current carrying terminals (e.g. source and drain) with a channel 23 therebetween. The first and second current carrying terminals will hereinafter be referred to as source and drain.

An insulating layer 25 is positioned overlying first semi-conductive layer 20 and a portion of dielectric stack 16, with portions of the first and second doped regions 21 and 22 exposed. It will be understood that insulating layer 25 will normally be deposited in a blanket layer and patterned to overlie first semiconductive layer 20 and a portion of dielectric stack 16 for each pixel 10. The thickness of insulating layer 25 overlying the portion of dielectric stack 16 is adjusted to define an optical length (as will be described below) of microcavity 17 such that light emitted from microcavity 17 is enhanced. In a preferred embodiment, the deposition of the blanket layer and patterning thereof will determine the thickness of layer 25. Insulating layer 25 is preferably formed of SiO2 or other oxides, nitrides or the like.

A semiconductor layer 26, heavily doped (preferably n+) for good conduction, is positioned on insulating layer 25. A portion of semiconductor layer 26 overlying channel 23 forms a control terminal (e.g. a gate), and a left most portion of semiconductor layer 26, as seen in FIG. 2, overlies a portion of doped region 21. Capacitor 14 is defined by the overlying portions of semiconductor layer 26 and doped region 21. The overlap is achieved by positioning channel 23 off center to the right as seen with reference to FIG. 2, within layer 20. Generally, doped region 21 is formed larger than doped region 22 to provide this offset. Providing a pre-determined capacitance of capacitor 14 is achieved by adjusting an area of overlie of first doped region 21 and second semiconductive layer 26. The area of overlie can be easily controlled by changing the area of doped region 21, i.e. the source terminal. This unique placement of capacitor 14 reduces processing steps and space requirements, as well as connecting capacitor 14 between the control terminal (e.g. gate) and the source. The processing steps are reduced because no additional layers are added. A re-apportionment of existing layers produces capacitor 14.

Contact metal 31 is positioned on the exposed portion of first doped region 21 and operates as an external electrical contact to the source terminal formed by doped region 21. With additional reference to FIG. 1, contact metal 31 extends to adjacent power TFTs in the same column and connects all source terminals formed by doped regions 21 to ground.

OED 15 includes a first terminal connected to the drain terminal. The first terminal is formed by depositing a transparent conductive layer 32, such as ITO or other transparent conductor, on insulating layer 25 and the exposed portion of second doped region 22 so as to be in electrical communication with the drain. Then a passivation layer 36 of an insulating material such as $SiO_2$ is deposited over the surface of TFT 12 to electrically isolate the gate from subsequently deposited organic layers. At least one organic electroluminescent layer 33 is deposited on transparent conductive layer 32. A conductive layer 35 defining a second terminal is deposited overlying organic electroluminescent layer 33. Conductive layer 35 provides an external electrical contact for the application of power to OED 15. Conductive layer 35 also provides passivation for the entire structure.

Microcavity 17 is illustrated in FIG. 2 as including organic electroluminescent layer 33, transparent conductive layer 32, insulating layer 25 and dielectric stack 16. The combined thickness of organic layer 33, transparent conductive layer 32, and insulating layer 25 is designed to position dielectric stack 16 in spaced relationship from reflective conductive layer 35 and define an optical length of microcavity 17.

Figure 3:
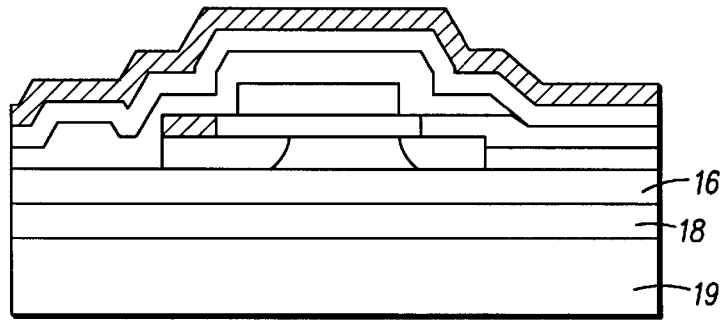
FIG. 3 is a simplified sectional view of another embodiment of a light emitting apparatus according to the present invention.

Referring now to FIG. 3, another embodiment of a light emitting apparatus is illustrated, wherein components similar to those in the embodiment of FIG. 2 are designated with similar reference characters. In this embodiment, the supporting structure not only includes transparent substrate 19, but a filter layer 18 positioned intermediate dielectric stack 16 and transparent substrate 19. Filter layer 18 is provided for filtering the enhanced light output of microcavity 17 to produce one or more colors depending upon the application. For example, when white light is generated within a pixel 10, filter layer 18 can provide a plurality of colors, namely red, green and blue.

While addressing TFT 13 is not illustrated in FIGS. 2 and 3, it will be understood that it can be integrated in a variety of techniques and positions not material to the present invention.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Light emitting apparatus comprising:
    a thin film transistor including a semiconductive layer having spaced apart first and second doped regions defining first and second current carrying terminals with a channel therebetween, an insulating layer overlying the channel and a control terminal formed on the insulating layer, and a portion of the control terminal overlying a portion of the first doped region;
    a capacitor defined by the overlying portions of the control terminal and the first doped region; and
    an organic electroluminescent device having a first terminal connected to the second current carrying terminal; and
    a microcavity structure in cooperation with the organic electroluminescent device defining an optical length of the microcavity structure, including a transparent spacer positioned adjacent the organic electroluiminescent device and a plurality of layers of dielectric material having different indexes of refraction such that the plurality of layers operates as a mirror stack, the plurality of layers being positioned on the transparent spacer so as to reflect light toward the organic electroluminescent device and to cooperate with the transparent spacer and the organic electroluminescent device to define an optical length of the microcavity.

2. Light emitting apparatus as claimed in claim 1 further including a filter layer positioned adjacent the dielectric stack for filtering the enhanced light output.

3. Light emitting apparatus as claimed in claim 2 wherein the filter layer is designed to produce red, green, and blue light output.

4. Light emitting apparatus including an active matrix comprising:
    a plurality of addressable pixels formed on a substrate;
    each pixel including;
        a thin film transistor having a semiconductive layer with spaced apart first and second doped regions defining first and second current carrying terminals and a channel therebetween, an insulating layer overlying the channel and a control terminal formed on the insulating layer, a portion of the control terminal overlying a portion of the first doped region, and the channel of the semiconductive layer positioned off center to define the first doped region larger than the second doped region;
        a capacitor defined by the overlying portions of the control terminal and the first doped region; and
        an organic electroluminescent device having a first terminal connected to the second current carrying terminal; and
    a microcavity structure in cooperation with the organic electroluminescent device defining an optical length of the microcavity structure.

5. Light emitting apparatus including an active matrix as claimed in claim 4 wherein each pixel further includes an addressing transistor having a control terminal coupled to one of a column and row bus, a first current carrying terminal coupled to the other of the column and row bus, and a second current carrying terminal coupled to the control terminal of the thin film transistor.

6. Light emitting apparatus including an active matrix as claimed in claim 4 wherein the organic electroluminescent device includes a second terminal coupled to a current source.

7. Light emitting apparatus comprising:
    a thin film transistor including a semiconductive layer having spaced apart first and second doped regions defining first and second current carrying terminals with a channel therebetween, an insulating layer overlying the channel and a control terminal formed on the insulating layer, a portion of the control terminal overlying a portion of the first doped region, and the channel of the semicondictive layer positioned off center to define the first doped region larger than the second doped region;
    a capacitor defined by the overlying portions of the control terminal and the first doped region; and
    an organic electroluminescent device having a first terminal connected to the second current carrying terminal; and
    a microcavity structure in cooperation with the organic electroluminescent device defining an optical length of the microcavity structure.

8. Light emitting apparatus including an active matrix comprising:
    a plurality of addressable pixels formed on a substrate;
    each pixel including;
        a thin film transistor having a semiconductive layer with spaced apart first and second doped regions defining first and second current carrying terminals and a channel therebetween, an insulating layer overlying the channel and a control terminal formed on the insulating layer, and a portion of the control terminal overlying a portion of the first doped region;
        a capacitor defined by the overlying portions of the control terminal and the first doped region; and
        an organic electroluminescent device having a first terminal connected to the second current carrying terminal; and a microcavity structure in cooperation with the organic electroluminescent device defining an optical length of the microcavity structure, including a transparent spacer positioned adjacent the organic electroluiminescent device and a plurality of layers of dielectric material having different indexes of refraction such that the plurality of layers operates as a mirror stack, the plurality of layers being positioned on the transparent spacer so as to reflect light toward the organic electroluminescent device and to cooperate with the transparent spacer and the organic electroluminescent device to define an optical length of the microcavity such that light emitted from the organic electroluminescent device is enhanced.

9. Light emitting apparatus as claimed in claim 8 further including a filter layer positioned adjacent the dielectric stack for filtering the enhanced light output.

10. Light emitting apparatus as claimed in claim 9 wherein the filter layer is designed to produce red, green, and blue light output.

* * * * *